United States Patent
Liu et al.

(10) Patent No.: US 8,813,350 B2
(45) Date of Patent: Aug. 26, 2014

(54) SOLDER BALL PATTERN FORMING

(75) Inventors: Niandong Liu, Eagan, MN (US);
William A. Nelson, Bloomington, MN (US); James O. Anderson, Robbinsdale, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/152,719

(22) Filed: Jun. 3, 2011

(65) Prior Publication Data

US 2012/0304456 A1    Dec. 6, 2012

(51) Int. Cl.
*H05K 13/00* (2006.01)

(52) U.S. Cl.
USPC ............. 29/743; 29/739; 29/760; 29/821; 222/160; 228/41

(58) Field of Classification Search
USPC .............. 228/41, 245, 246, 180.22; 222/160–172, 251–415, 424.5–457; 29/33 M, 281.6, 739, 743–747, 753, 29/760, 821
See application file for complete search history.

(56) References Cited

U.S. PATENT DOCUMENTS

| | | | |
|---|---|---|---|
| 4,189,066 A * | 2/1980 | Berghahn | 222/48 |
| 4,871,110 A | 10/1989 | Fukasawa et al. | |
| 5,222,634 A * | 6/1993 | Hayes | 222/185.1 |
| 5,745,986 A * | 5/1998 | Variot et al. | 29/840 |
| 5,762,258 A | 6/1998 | Le Coz et al. | |
| 5,816,482 A | 10/1998 | Grabbe | |
| 5,839,191 A | 11/1998 | Economy et al. | |
| 5,918,792 A * | 7/1999 | Stumpe et al. | 228/41 |
| 6,065,201 A * | 5/2000 | Sakai | 29/430 |
| 6,158,649 A * | 12/2000 | Miura | 228/246 |
| 6,176,008 B1 * | 1/2001 | Ueoka | 29/743 |
| 6,182,356 B1 * | 2/2001 | Bolde | 29/821 |
| 6,213,386 B1 | 4/2001 | Inoue et al. | |
| 6,253,985 B1 * | 7/2001 | Kajii | 228/41 |
| 6,270,002 B1 * | 8/2001 | Hayashi et al. | 228/246 |
| 6,390,351 B1 * | 5/2002 | Kasai et al. | 228/41 |
| 6,766,938 B2 | 7/2004 | Cheng et al. | |
| 6,830,175 B2 * | 12/2004 | Ito | 228/41 |
| 7,100,813 B2 | 9/2006 | Bayot | |
| 7,458,499 B2 * | 12/2008 | Ng et al. | 228/246 |
| 7,635,079 B1 * | 12/2009 | Cobbley et al. | 29/740 |
| 8,348,132 B2 * | 1/2013 | Park | 228/41 |
| 2002/0139730 A1 * | 10/2002 | Itou et al. | 209/686 |
| 2007/0130764 A1 * | 6/2007 | Nebashi et al. | 29/843 |
| 2009/0307899 A1 * | 12/2009 | Nebashi et al. | 29/739 |
| 2009/0307900 A1 * | 12/2009 | Ikeda | 29/743 |

* cited by examiner

*Primary Examiner* — Peter DungBa Vo
*Assistant Examiner* — Kaying Kue
(74) *Attorney, Agent, or Firm* — Hall Estill Attorneys at Law

(57) ABSTRACT

A ball grid array presentment apparatus and associated method are provided. The apparatus has a stationary guard defining a first passage. A core is mounted adjacent to the stationary guard, the core being operably moveable between an unload position and a second position. The core defines a second passage and supports a workpiece fixture operably retaining the ball grid array. The unload position of the core operably aligns the second passage to the first passage, the aligned passages being sized to permit access to unload the ball grid array from the workpiece fixture. The second position of the core operably misaligns the second passage from the first passage whereat the core and the stationary guard cooperatively form an enclosure around the workpiece fixture containing a supply of balls that are not retained in the ball grid array.

29 Claims, 7 Drawing Sheets

SOLDER BALL PATTERN FORMING

SUMMARY

In some embodiments a ball grid array presentment apparatus is provided having a stationary guard defining a first passage. A core is mounted adjacent to the stationary guard, the core being operably moveable between an unload position and a second position. The core defines a second passage and supports a workpiece fixture operably retaining the ball grid array. The unload position of the core operably aligns the second passage to the first passage, the aligned passages being sized to permit access to unload the ball grid array from the workpiece fixture. The second position of the core operably misaligns the second passage from the first passage whereat the core and the stationary guard cooperatively form an enclosure around the workpiece fixture containing a supply of balls that are not retained in the ball grid array.

In some embodiments a workpiece presentment apparatus is provided having a platen with receiving features arranged to retain a plurality of workpieces to define a workpiece array. A core supports the platen in selective rotation between an unload rotational position and a second rotational position. At the unload rotational position a planar surface of the platen is substantially orthogonal to gravitational force. At the second rotational position the planar surface of the platen is nearly parallel with gravitational force. A motor rotates the core from the unload rotational position toward the second rotational position by variably accelerating the core to impart an arcuate motion to the platen characterized by a plurality of sequential discrete arcuate motions.

In some embodiments a method is provided that includes steps of: obtaining a core adjacent to a stationary guard, the core defining a reservoir and supporting a platen having receiving features; placing a plurality of balls in the reservoir; and rotating the core in a first rotational direction to bring a portion of the core into a close mating engagement with the stationary guard to form an enclosure containing the plurality of balls as the plurality of balls disperses out of the reservoir to traverse the platen, the rotating step characterized by variably accelerating the core to move the platen in a manner characterized by a plurality of sequential discrete arcuate motions in order to sufficiently excite the balls as they traverse the platen to overcome dynamic and static friction as the balls contact the core, platen, and other balls.

BRIEF DESCRIPTION OF THE DRAWINGS

FIG. 9 is a functional block diagram of the control system that variably accelerates the core in accordance with embodiments of the present invention.

DETAILED DESCRIPTION

Modern manufacturing systems are for the most part built upon a platform of processor based automated devices. Such technology solutions are key to meeting the demand for increasing both process capability and efficiency in the way workpieces are handled during manufacturing. An example of the application of such technology solutions is seen in the evolution of the way that soldering material is handled in manufacturing electronic products, such as printed circuit board assemblies (PCBAs). Not long ago that was mostly a manual operation in which a human operator would pick individual pieces of solder and place them at respective appointed locations, enabling subsequent processing to create permanent electrical connections. The embodiments of the present invention are described below in terms of an automated solution to the task of repeatedly picking and placing pieces of solder material from a bulk supply. However, those described embodiments are merely illustrative and not limiting of the scope of the claimed invention, in that the skilled artisan readily recognizes that the principles described herein can alternatively be employed to handle other types of materials than solder in equivalent alternative embodiments.

Miniaturization of consumer electronics goods has created the concomitant demand for miniaturization of the PCBA, and hence the components used to fabricate the PCBA, such as the pieces of solder used to make permanent electrical connections. The use of smaller size solder pieces, such as small spherical solder balls, brings into play some process variables that heretofore could be ignored as negligible. Particularly, smaller solder balls have comparatively less mass and thereby are more susceptible to disadvantageously clustering on a work surface due to dynamic or static friction between each solder ball and the work surface or other solder balls.

Figure 1:
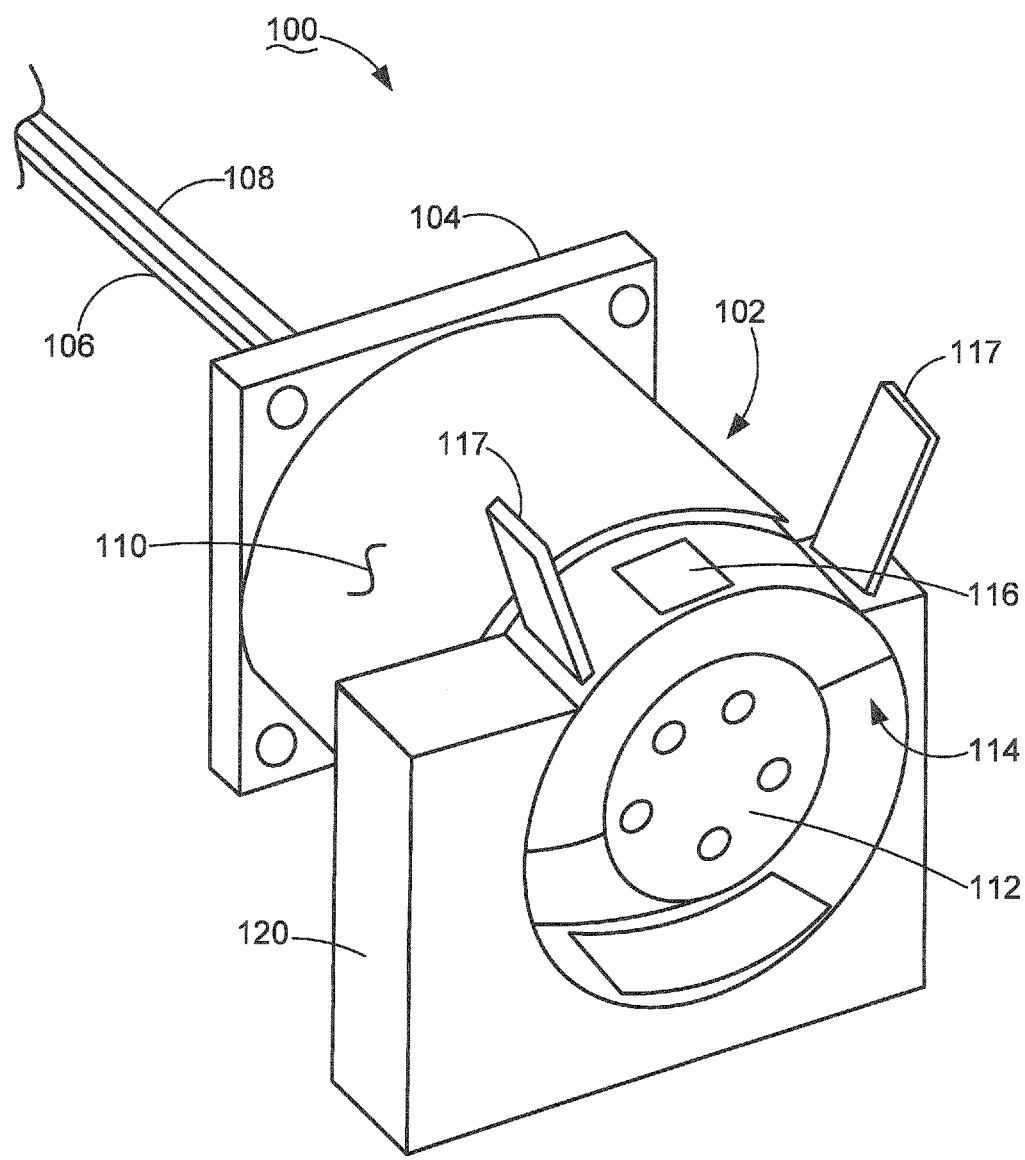
FIG. 1 is an isometric depiction of a ball grid forming apparatus that is constructed in accordance with embodiments of the present invention.

FIG. 1 is an isometric depiction of a ball grid array presentment apparatus 100 that is constructed in accordance with the present embodiments for overcoming the difficulties associated with automatically picking and placing smaller size solder balls. The apparatus 100 generally includes a rotary stage 102 depending from a flange 104 for straightforward mounting the apparatus 100 in a manufacturing system or cell (not shown) by the use of fasteners passed through a hole pattern in the flange 104. The rotary stage 102 is generally a selectively controllable rotary positioning device, such as an electrical, magnetic, or pneumatic motor with an encoder or other positional indicia and controls executing programming instructions stored in memory to rotate in accordance with a predetermined desired direction and speed and in response to a set of predetermined feedbacks. Although the description focuses on rotary movements, the described embodiments are illustrative and not limiting in that the skilled artisan appreciates that other types of movements, such as linear movements and combined rotary and linear movements, are likewise contemplated within the claimed embodiments.

A couple of utility lines, a vacuum line 106 and an inert gas line 108, encroach the rotary stage 102 to deliver fluids enhancing the operation of the rotary stage 102 as described below. The rotary stage 102 has a stationary outer housing 110 that journals a rotatable core 112 in selective rotational movement. A presentment assembly 114 is attached to the rotatable core 112 and is thus affixed in selected rotation with the core 112. Importantly, it will be noted that in these depicted embodiments the presentment assembly 114 permits access, in a vertical access direction in FIG. 1, to a work surface 116 (also referred to herein as "platen" or "workpiece fixture") on which a plurality of the solder balls are retained. A couple of fluid brushes 117 (partially depicted) are aimed toward the presentment assembly 114 to selectively impart a pressurized fluid stream to agitate the balls as they traverse the work surface 116. At best the fluid brushes 117 are only occasionally necessary to alleviate an observed ball clustering, such as might be automatically detected by a vision or vacuum feedback system providing inputs to selectively operate one or both of the fluid brushes 117.

Figure 2:
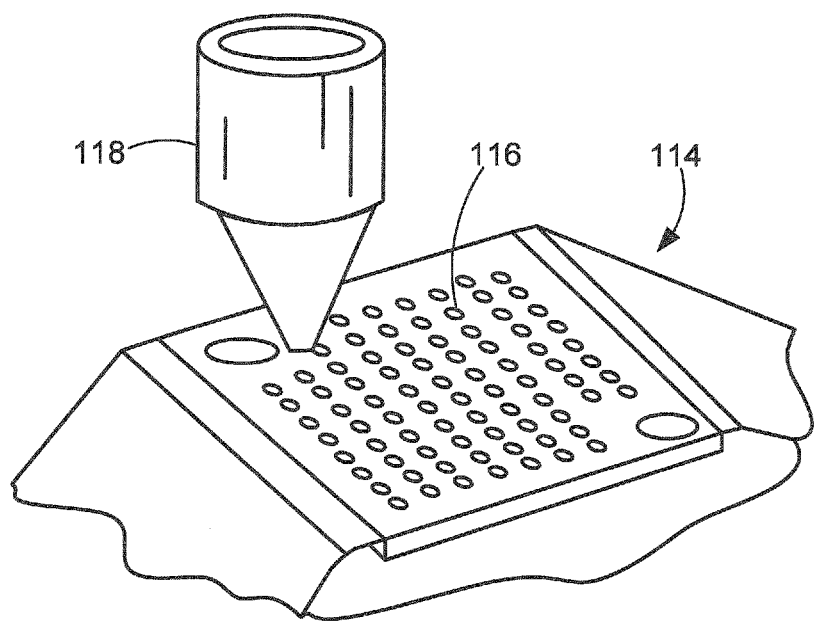
FIG. 2 is an enlarged portion of FIG. 1 showing a pick and place device removing the balls in the ball grid array from the work surface.

FIG. 2 depicts illustrative embodiments of how the plurality of solder balls are retained in a predetermined pattern (in this case a pattern of eighty solder balls) to define what is referred to herein as a ball grid array. Preferably, the access to the ball grid array is adequately large to permit picking the solder balls from the work surface 116 with an end effector 118 portion of an automated pick and place system. Although the depicted end effector 118 picks only one solder ball at a time, in advantageous alternative embodiments a plurality of or even all the solder balls are picked at the same time from the work surface 116.

Figure 3:
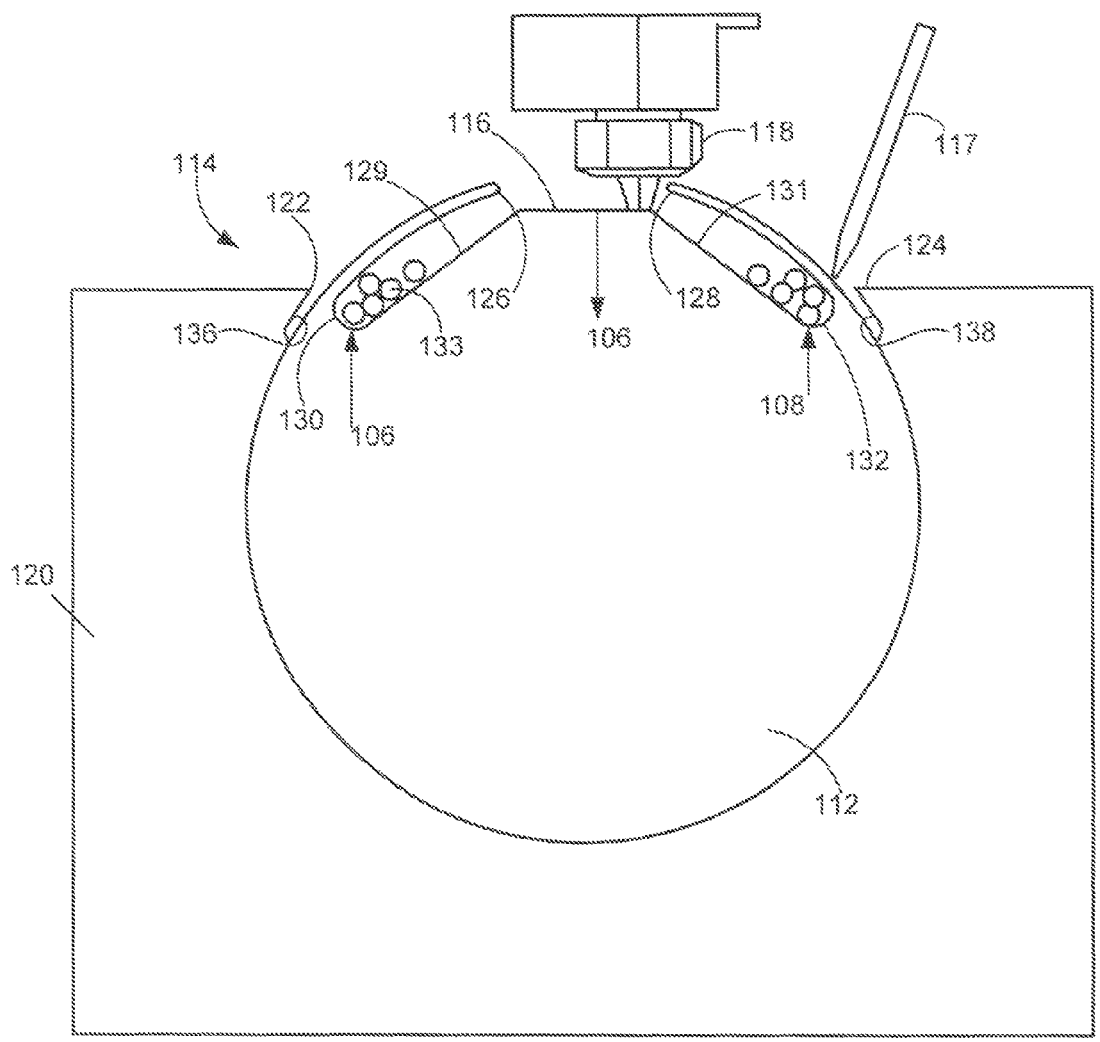
FIG. 3 diagrammatically depicts the ball grid forming apparatus of FIG. 1 in the unload rotational position.
Figure 6:
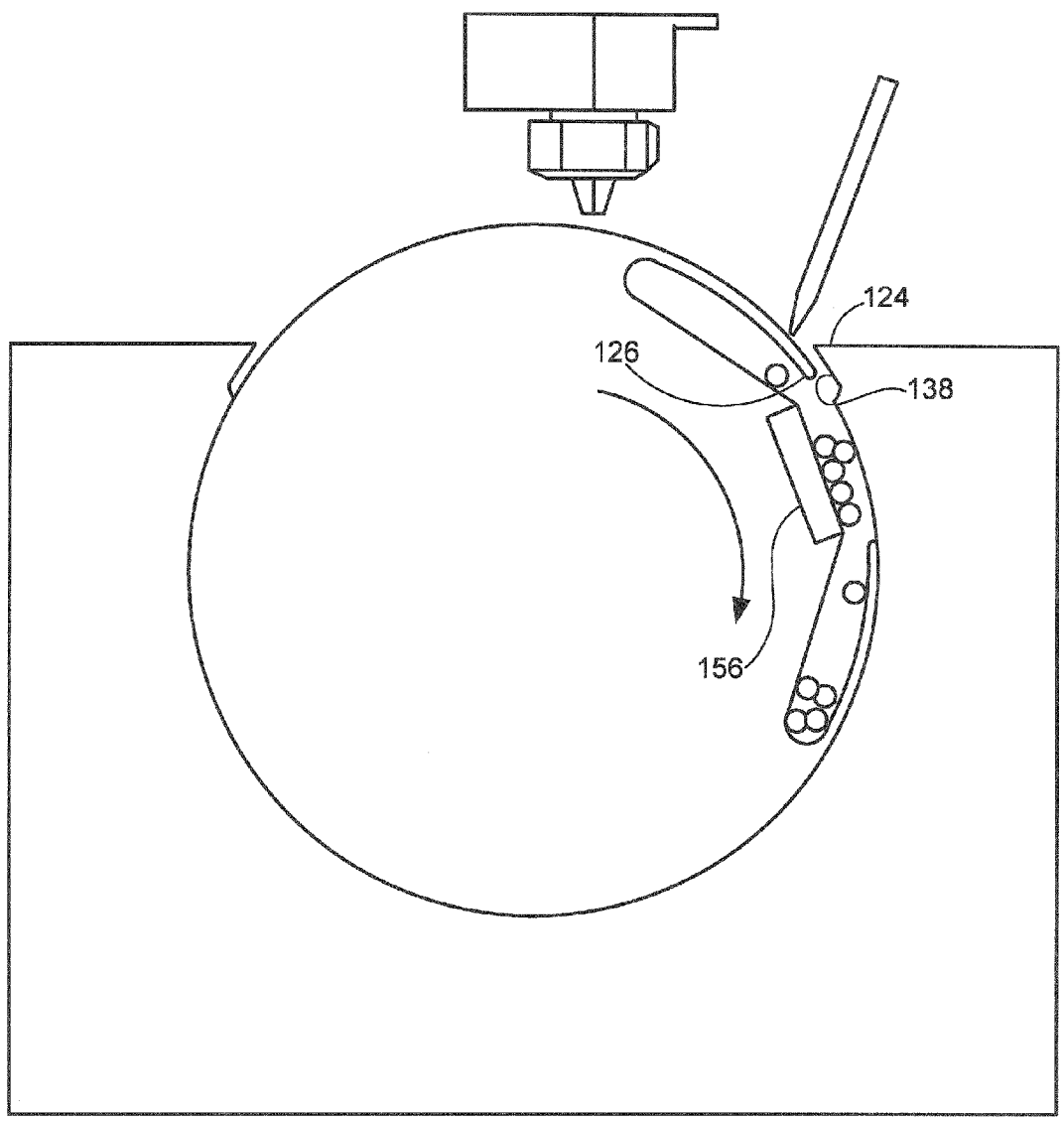
FIG. 6 is a view similar to FIG. 3 but after the core has rotated clockwise.

Returning momentarily to FIG. 1, the core 112 is mounted adjacent to a stationary guard 120 that cooperates with movements of the core 112 between the unload rotational position depiction depicted in FIGS. 1 and 3, where retained balls are picked from the grid array on the work surface 116, and another rotational position depicted in FIG. 6, where the next ball grid array is retained on the work surface 116. In alternative equivalent embodiments, not depicted, the stationary guard 120 can be formed as a portion of the stationary housing 110 that journals the core 112 in rotational movements.

FIG. 3 diagrammatically depicts the core 112 at the unload rotational position, as depicted in FIG. 1. This unload rotational position advantageously makes maximum use of the gravitational force in retaining the ball grid array in place, by way of the fact that the work surface 116 is substantially orthogonal to the gravitational force. Note that access by the end effector 118 to the work surface 116 is via a first passage in the stationary guard 120 defined between arcuate protuberant portions 122, 124. That access is also via a second passage in the core 112 defined between arcuate protuberant portions 126, 128.

Opposing reservoirs 130, 132 hold an oversupply of the solder balls 133 for subsequent processing in which they eventually become retained in a ball grid array. Again, the claimed embodiments here are depicted diagrammatically, entirely for clarity sake. The diagrammatical dimensions of the depicted size of the solder balls 133 in relation to the depicted size of the reservoirs 130, 132 does not well inform the fact that in reality there can be as many as about a million of the solder balls 133 in one of the reservoirs 130, 132. However, no other disclosure other the diagrammatical depiction provided is necessary for the skilled artisan to understand the scope of the embodiments as described and claimed.

Figure 4:
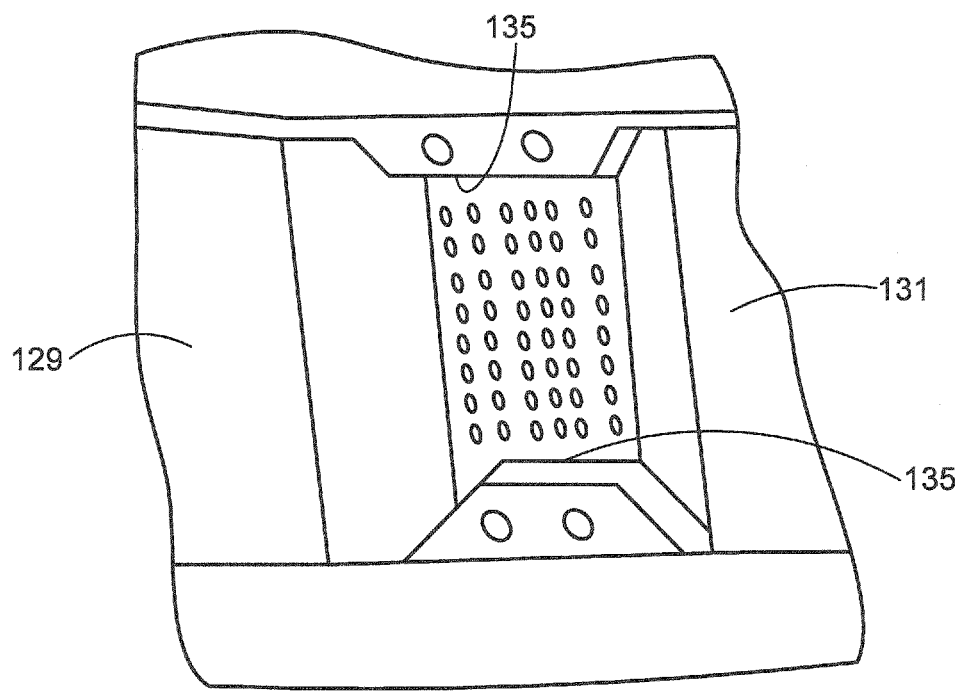
FIG. 4 is an enlarged top view of the work surface portion of the ball grid forming apparatus of FIG. 1.

Surfaces 129, 131 provide for a smooth transition from the respective reservoirs 130, 132 to the work surface 116, minimizing the excitation energy necessary to disperse the balls 133 evenly from the reservoirs 130, 132 across the work surface 116. One or more upstanding, and in FIG. 4 opposing, guide surfaces 135 can advantageously be used to crowd the dispersion of the balls 133 from the reservoirs 130, 132 evenly across the work surface 116.

Figure 5:
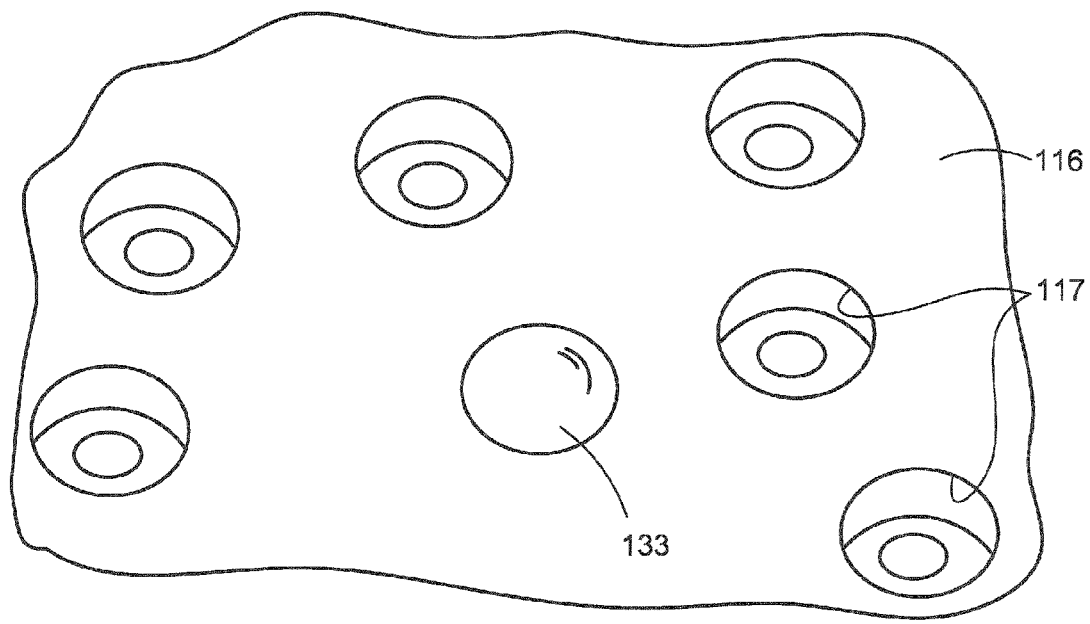
FIG. 5 is an enlarge view of apertures in the work surface that retain balls in the ball grid array.

Returning to FIG. 3, the inert gas line 108 is diagrammatically depicted for the manner in which it injects an inert gas, such as nitrogen, from a remote supply into each reservoir 130, 132. That prevents the condensation of atmospheric humidity that could otherwise disadvantageously cluster the solder balls 133 together in an air environment. The vacuum line 106 is diagrammatically depicted for the manner in which it presents a retention force from a remote vacuum source to the work surface 116. For example, the vacuum line 106 can communicate a vacuum to a pattern of apertures 117 in the work surface 116 as depicted in FIG. 5. That urges the balls 133 into the receiving features (such as apertures 117) where they are retained to fashion the ball grid array. Note that the apertures 117 are preferably counterbored of a size to positively receivingly engage a ball 133.

Again, the core 112 is operably moveable between the unload position of FIGS. 1 and 3 and the second rotational position, such as near a maximum extent of rotational movement in a clockwise direction depicted in FIG. 6. The latter rotational position makes maximal use of gravitational force in shedding excess balls 133 from the work surface 116, by virtue of the fact that the work surface 116 here is nearly parallel to the gravitational force.

Note that in the second rotational position in FIG. 6 the second passage defined by the core 112 is misaligned with the first passage defined by the stationary guard 120. An effect of that misalignment is that the core's arcuate protuberant portion 126 has rotated into a close mating engagement with the guard's arcuate protuberant portion 124 to form a closed enclosure around the work surface 116. That enclosure advantageously permits exciting the balls 133 to a much greater extent than otherwise without such an enclosure, by eliminating the risk of balls 133 spilling out of the presentment assembly 114. The higher excitation overcomes the dynamic and static friction forces that the balls 133 otherwise encounter in traversing the work surface 116.

The increased excitation energy afforded by the present embodiments can be imparted both in the manner and the extent with which the core 112 is selectively rotated. That is, as discussed below, the core 112 can be rotated in a manner that oscillates, or in other words dithers, the work surface 116 to increase the magnitude of the imparted excitation energy. The threshold desired excitation is aimed at keeping the balls in continuous movement as they traverse the work surface 116. The enclosed work surface 116 likewise permits accelerating the core 112 at a greater rate than otherwise permissible, and to accelerate the core 112 over a greater extent of rotational movement than otherwise permissible.

Clearance notches 136, 138 can be defined in the distal ends of the guard's respective protuberant arcuate portions 122, 124. The notches 136, 138 advantageously facilitate reliable overlapping engagement of the core's protuberant arcuate portion 126, 128 within the guard's respective protuberant arcuate portions 122, 124. It will be noted that the notches 136, 138 are not necessary for reliable entry of the leading one of the core's protuberant arcuate portion, such as the core protuberant arcuate portion 128 during the clockwise rotation of FIG. 6, due to the cantilevered construction of the core protuberant portion 128 depending from the main body of the presentment assembly 114. That is, the closed leading ends of the reservoirs 130, 132 opposite the core's protuberant arcuate portions 126, 128 can be sized to clearingly disengage the bore defined by the guard 120 notwithstanding any effect of the notches 136, 138.

Figure 7:
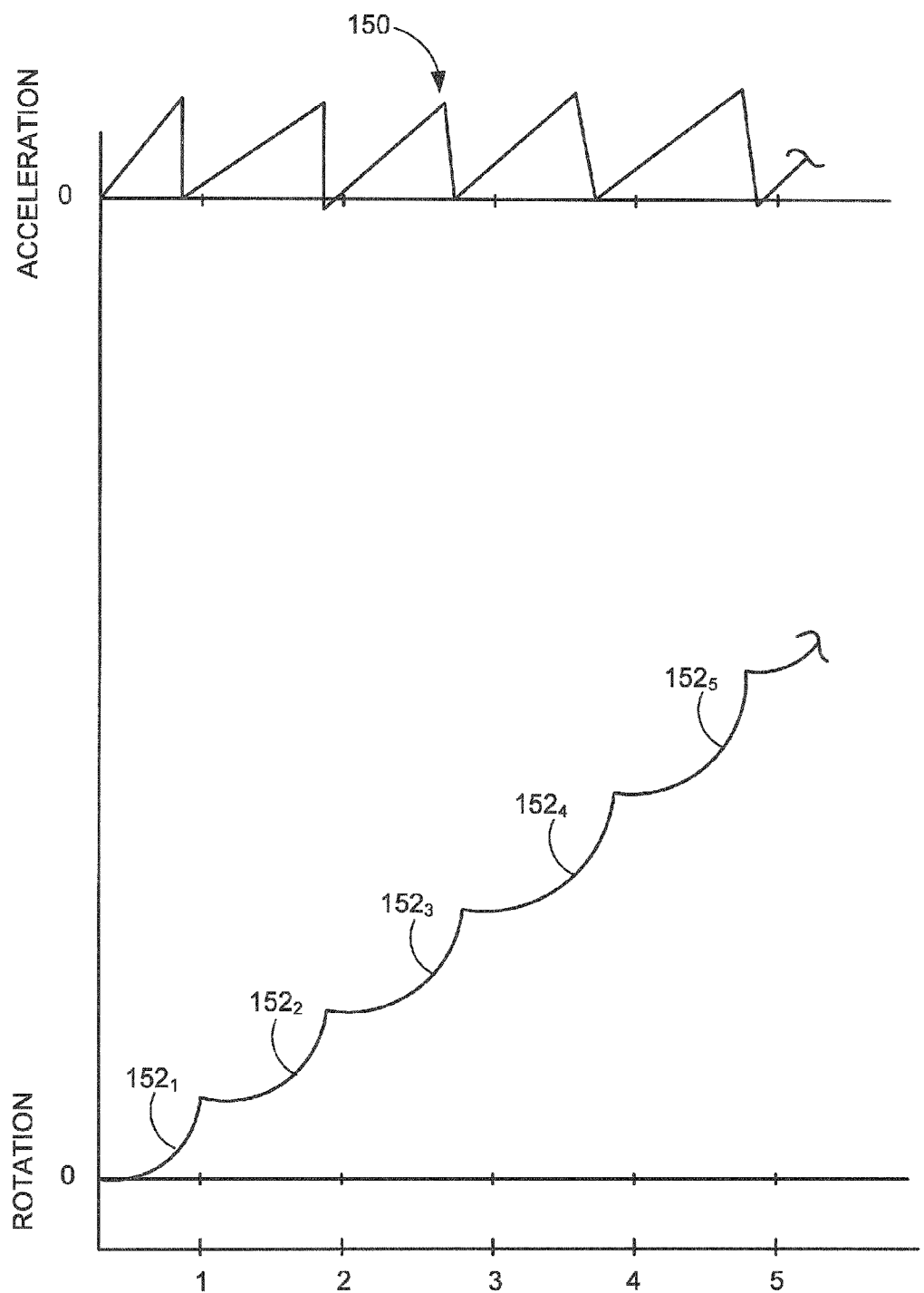
Figure 8:
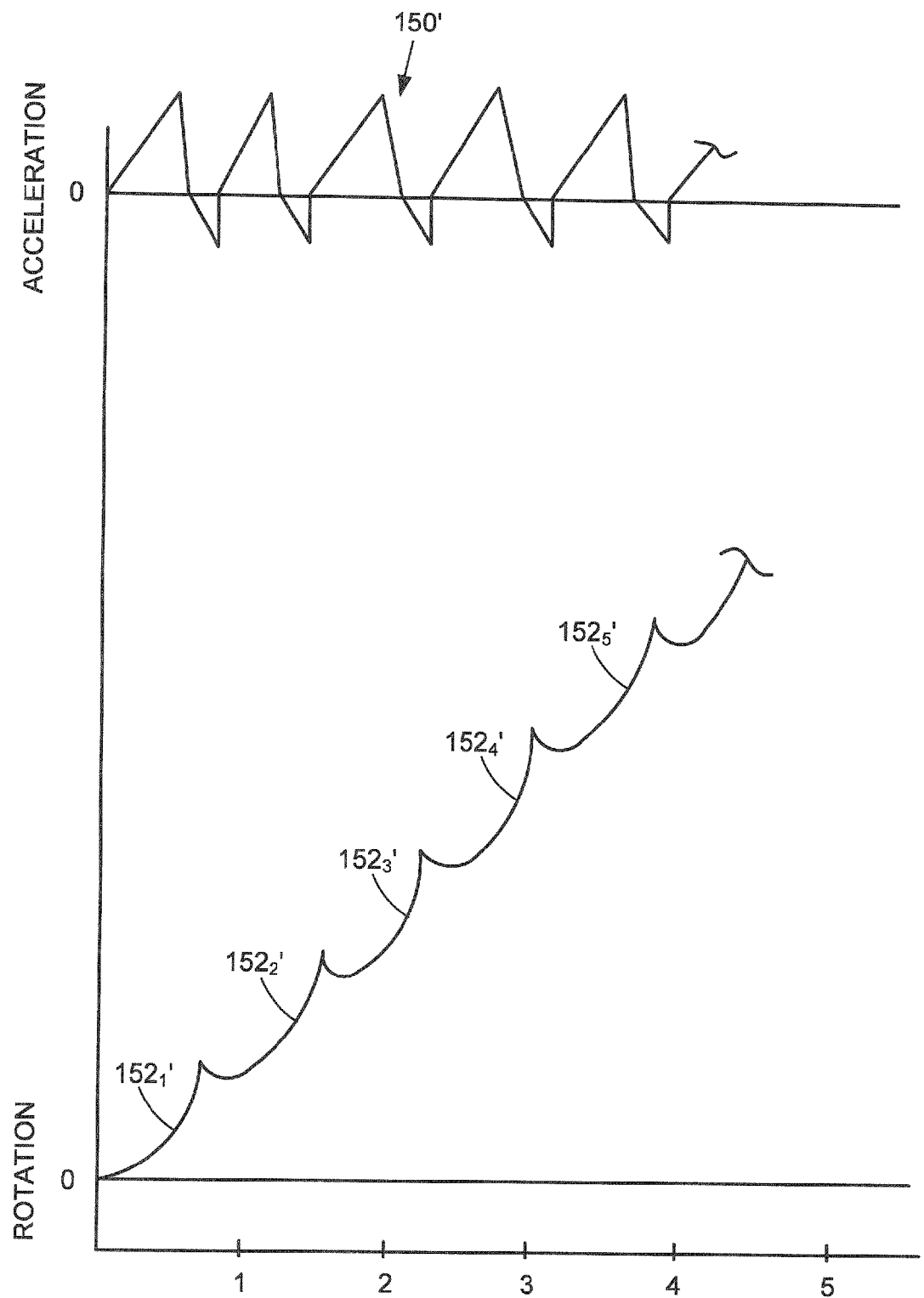

As mentioned previously, embodiments of the present invention advantageously manipulate the manner in which rotational movement is imparted to the core 112 in order to increase the excitation to the balls 133 to keep them in continuous movement until either being urged into one of the receiving features or else completely traversing the work surface 116 into the opposing reservoir 130, 132. FIG. 7 graphically depicts an illustrative sawtooth acceleration curve 150 contemplated by the present embodiments to impart a motion to the work surface 116 that is defined by a plurality of sequential discrete arcuate motions $152_n$. That is, from start to time $t_1$ a constant positive (such as clockwise) acceleration is imparted to the core 112 to rotate it according to the nonlinear displacement response in the discrete arcuate motion $152_1$. The resulting nonlinear response defined by the plurality of sequential discrete arcuate motions $152_1$-$152_5$ include a number of abrupt starts and momentary stops. That imparts significantly more excitation to the work surface 116 in comparison to a constant acceleration of the core 112 from start to time $T_5$. FIG. 8 graphically depicts an alternative illustrative sawtooth acceleration curve 150' constituted of both positive (clockwise) and negative (counterclockwise) accelerations to impart an oscillatory, sometimes referred to as a dithering, motion wherein each of the discrete arcuate motions $152_1'$-$152_5'$ are bidirectional. The bidirectional movements of the acceleration curve of FIG. 8 provide comparatively greater excitation energy than that of FIG. 7.

In addition to the aforedescribed manner and extent in which the core 112 is rotated in order to excite the balls 133 while they traverse the work surface 116, FIG. 6 depicts how additional excitation can be provided by a vibrator device 156 mounted in the presentment apparatus 114 in proximity to the work surface 116. The vibrator device 156 can be a piezoelectric shaker device or the like.

Figure 9:
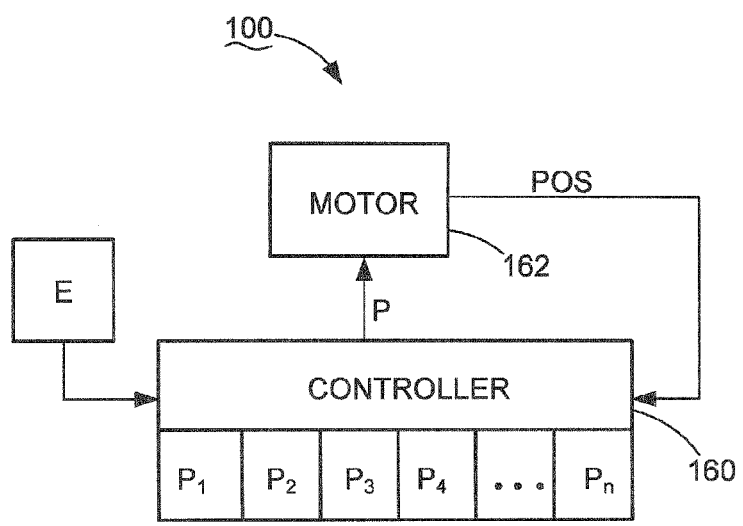
FIGS. 7 and 9 graphically depict illustrative acceleration profiles employed in accordance with illustrative embodiments of the present invention.

FIG. 9 depicts a functional block diagram of a motor speed control system of the apparatus 100 in accordance with embodiments of the present invention. A controller 160 is a processor based computing device executing programming instructions stored in memory to provide an acceleration profile P to the motor 162 which, in turn, rotates the core 112. The controller 160 can implement a selected profile from a stored plurality of different profiles $P_1$, $P_2$, $P_3$, ... $P_n$, such as the profiles described in FIGS. 7 and 8. A rotary position signal POS can be used in making that selection of which profile to implement. For example, the controller 160 might advantageously start rotation from the unload position (FIG. 3) with a comparatively less aggressive acceleration profile because the size of the exposed opening is at the maximum, meaning too much excitation is more likely to displace a ball 133 out of the core 112. As the rotation proceeds, however, the size of the exposed opening progressively diminishes, as could be monitored by the POS feedback or perhaps in terms of time since the rotation began. Certainly, by the time the core 112 is rotated enough to form the closed enclosure (FIG. 6), then the controller 160 might advantageously switch to a more aggressive acceleration profile, such as a repeated dithering motion, to clear all but the balls included in the ball grid array from the work surface 116 in a minimum amount of time.

The controller 160 can also receive an indication of an error E that can alter the profile it selects to implement. The error can include a vision system that monitors the work surface 116 for any excess balls 133 not included in the ball grid array. In such an occurrence the controller 160 can take remedial actions such as implementing additional movements of the core 112 in an attempt to clear the excess ball 133. The controller 160 could implement other remedial actions as well such as activating one or both of the fluid brushes 117 in conjunction with the additional movements of the core 112. The controller 160 can also empirically assess the effectiveness of the currently selected one or more profiles based on the incidence rate of detected errors. If a threshold error rate is exceeded then the controller 160 can implement remedial actions involving switching to implement another profile or another combination of profiles, and/or modifying the timing of the current profile(s). Alternatively, the error E can be a feedback signal arising from monitoring the vacuum pressure in the vacuum line 106 in relation to the cycle time required to completely fill the ball grid array. That is, the time it takes to achieve the deadhead vacuum pressure from a full ball grid array can be monitored and used by the controller to select which profile to implement when the monitored time varies beyond what is expected.

Embodiments of the present invention also contemplate a method corresponding to the apparatus described above. Illustrative embodiments of the method include a step of rotating the core adjacent to the stationary guard, the core defining the reservoir and supporting the platen having receiving features. A plurality of the balls is then placed in the reservoir. The core is then rotated in a first rotational direction to bring a portion of the core into a close mating engagement with the stationary guard to form the enclosure containing the plurality of balls as they disperse out of the reservoir to traverse the platen. The rotating step is characterized by variably accelerating the core to move the platen in a manner characterized by a plurality of sequential discrete arcuate motions in order to sufficiently excite the balls as they traverse the platen to overcome dynamic and static friction as the balls contact the core, platen, and other balls.

The rotating the core step can be characterized by all of the sequential discrete arcuate motions being in the first rotational direction. Alternatively, at least one or more of the sequential discrete arcuate motions can be bidirectional. Additionally, the rotating the core step can be characterized by imparting high frequency constant amplitude excitation energy to the platen.

The rotating the core step is considered complete when the core comes to a first rotational position whereat the surface of the platen is nearly parallel with gravitational force. At that rotational position a plurality of balls have previously been retained in the ball grid array and the rest of the balls have traversed the platen and landed in the opposing second reservoir. The method then includes rotating the core in the opposing rotational direction until the first passage defined by the stationary guard is aligned with the second passage defined by the core at the unload rotational position. Access provided by the aligned passages permits removing the ball grid array from the platen.

After removing the ball grid array from the platen at the unload rotational position of the core, the method further includes rotating the core in the opposing rotational direction to bring another portion of the core into a close mating engagement with another portion of the stationary guard to again form an enclosure containing the plurality of balls as the plurality of balls disperses out of the second reservoir to traverse the platen. The rotating step is again characterized by variably accelerating the core to move the platen in a manner characterized by a plurality of sequential discrete arcuate motions in order to sufficiently excite the balls as they traverse the platen to overcome dynamic and static friction as the balls contact the core, platen, and other balls.

The rotating the core in the opposing rotational direction step is complete when the core comes to a second rotational position whereat the surface of the platen is again nearly parallel with gravitational force. At that position another plurality of balls have previously been retained in the receiving features defining another ball grid array, and the rest of the balls not retained in the another ball grid array have previously traversed the platen and landed in the first reservoir.

It is to be understood that even though numerous characteristics and advantages of various aspects have been set forth in the foregoing description, together with details of the structure and function, this disclosure is illustrative only, and changes may be made in detail, especially in matters of structure and arrangement to the full extent indicated by the broad general meaning of the terms in which the appended claims are expressed.

What is claimed:

1. A ball grid array presentment apparatus comprising; a stationary guard defining a first passage; a core mounted adjacent to the stationary guard operably moveable between an unload position and a second position, the core defining a second passage and supporting a workpiece fixture operably retaining a ball grid array, the unload position of the core operably aligning the second passage to the first passage, the aligned passages being sized to permit access to unload the ball grid array from the workpiece fixture, and the second position of the core operably misaligning the second passage from the first passage so that the stationary guard covers the second passage of the core when the core is at the second position to contain a supply of balls that are not retained in the ball grid array.

2. The apparatus of claim 1 wherein the stationary guard is defined by a housing that supports the core in its movement between the first and second positions.

3. The apparatus of claim 1 wherein a protuberant portion of the core defining the second passage engages in a close mating relationship a protuberant portion of the stationary guard defining the first passage at the second position of the core.

4. The apparatus of claim 3 wherein an arcuate portion of the core defining the second passage engages in a close mating relationship an arcuate portion of the stationary guard defining the first passage at the second position of the core.

5. The apparatus of claim 4 wherein the close mating relationship is characterized by a notch in the arcuate portion of the stationary guard that is sized to closely receive a distal end portion of the arcuate portion of the core at the second position of the core.

6. The apparatus of claim 1 comprising a reservoir sized to contain a plurality of the balls adjacent the workpiece fixture, and to disperse the plurality of balls from the reservoir and across the workpiece fixture as a result of rotation of the core in a first rotational direction.

7. The apparatus of claim 6 wherein the workpiece fixture defines a plurality of apertures, each aperture sized to receivingly engage and thereby retain one of the balls dispersed across the workpiece fixture, the retained ball forming a portion of the ball grid array.

8. The apparatus of claim 7 comprising a vacuum source communicating an evacuating force to the apertures to urge balls into the apertures.

9. The apparatus of claim 7 comprising a guide having an upstanding surface that directs the dispersed plurality of balls from the reservoir toward the plurality of apertures.

10. The apparatus of claim 7 wherein the reservoir is characterized as a first reservoir, and comprising a second reservoir opposing the first reservoir into which balls that are not retained after traversing the workpiece fixture accumulate as the result of the rotation of the core in the first rotational direction.

11. The apparatus of claim 10 wherein at least one of the reservoirs maintains an inert gas rich environment.

12. The apparatus of claim 1 comprising a motor moving the core from the unload position toward the second position, the motor imparting a motion to the workpiece fixture defined by a plurality of sequential discrete arcuate motions.

13. The apparatus of claim 12 wherein all of the sequential discrete arcuate motions are in a first rotational direction.

14. The apparatus of claim 12 wherein at least one or more of the sequential discrete arcuate motions are bidirectional.

15. The apparatus of claim 12 further comprising a vibrator imparting high frequency constant amplitude excitation energy to the workpiece fixture.

16. A workpiece presentment apparatus comprising: a platen having receiving features arranged to retain a plurality of workpieces to define a workpiece array; a core supporting the platen in selective rotation between an unload rotational position and a second rotational position, whereat the unload rotational position a planar surface of the platen is substantially orthogonal to gravitational force and whereat the second rotational position the planar surface of the platen is nearly parallel with gravitational force; a stationary guard operably covering the planar surface at the second rotational position of the core; and a motor rotating the core from the unload rotational position toward the second rotational position by variably accelerating the core to impart an arcuate motion to the platen characterized by a plurality of sequential discrete arcuate motions.

17. The apparatus of claim 16 wherein all of the sequential discrete arcuate motions are in a first rotational direction.

18. The apparatus of claim 16 wherein at least one or more of the sequential discrete arcuate motions are bidirectional.

19. The apparatus of claim 16 wherein the stationary guard defines a first passage and the core defines a second passage, the unload rotational position of the core operably aligning the second passage to the first passage, the aligned passages sized to permit access to unload the workpiece array from the platen, the second rotational position of the core operably misaligning the second passage from the first passage.

20. The apparatus of claim 19 wherein an arcuate portion of the core defining the second passage engages in a close mating relationship an arcuate portion of the stationary guard defining the first passage to cooperatively form the enclosure at the second rotational position of the core.

21. The apparatus of claim 16 comprising a reservoir sized to contain a plurality of the workpieces adjacent the platen, and to disperse the plurality of workpieces across the platen as a result of rotation of the core in a first rotational direction.

22. The apparatus of claim 21 wherein the reservoir is characterized as a first reservoir, and comprising a second reservoir opposing the first reservoir into which workpieces that are not retained in the workpiece array after traversing the platen accumulate as the result of the rotation of the core in the first rotational direction.

23. A method comprising steps of:
placing a plurality of workpieces on a platen having receiving features arranged to retain the plurality of workpieces in a workpiece array;
actuating a motor to selectively rotate the core adjacent a stationary guard to move the platen from an unload rotational position toward a second rotational position, wherein at the unload rotational position a planar surface of the platen is substantially orthogonal to gravitational force and wherein at the second rotational position the planar surface is nearly parallel with gravitational force, wherein the rotation variably accelerates the core to move the platen by a plurality of sequential discrete arcuate motions and the stationary guard covers the planar surface at the second rotational position.

24. The method of claim 23 wherein the rotating the core step is characterized by all of the sequential discrete arcuate motions being in the first rotational direction.

25. The method of claim 23 wherein the rotating the core step is characterized by at least one or more of the sequential discrete arcuate motions being bidirectional.

26. The method of claim 23 wherein the rotating the core step is complete when the core comes to a first rotational position whereat the surface of the platen is nearly parallel with gravitational force, and whereat a plurality of workpieces are retained in the receiving features defining a workpiece grid array, the reservoir being characterized as a first reservoir and the rest of the workpieces not retained in the workpiece grid array having traversed the platen and being disposed in an opposing second reservoir.

27. The method of claim 26 comprising rotating the core in an opposing rotational direction until a first passage defined by the stationary guard is aligned with a second passage defined by the core at an unload rotational position, the aligned passages sized to permit access to remove the workpiece grid array from the platen.

28. The method of claim 27, after removing the workpiece grid array from the platen at the unload rotational position of the core, comprising rotating the core in the opposing rotational direction to bring another portion of the core into a close mating engagement with another portion of the stationary guard to again form an enclosure containing the plurality of workpieces as the plurality of workpieces disperses out of the second reservoir to traverse the platen, the rotating step again characterized by variably accelerating the core to move the platen in a manner characterized by a plurality of sequential discrete arcuate motions in order to sufficiently excite the workpieces as they traverse the platen.

29. The method of claim 28 wherein the rotating the core in the opposing rotational direction step is complete when the core comes to a second rotational position whereat the surface of the platen is again nearly parallel with gravitational force, and whereat another plurality of workpieces is retained in the receiving features defining another workpiece grid array, the rest of the workpieces not retained in the workpiece grid array having traversed the platen and landed in the first reservoir.

\* \* \* \* \*